(12) United States Patent
Standing et al.

(10) Patent No.: US 9,443,798 B2
(45) Date of Patent: Sep. 13, 2016

(54) PASSIVE COMPONENT AS THERMAL CAPACITANCE AND HEAT SINK

(71) Applicant: Infineon Technologies Austria AG, Villach (AT)

(72) Inventors: Martin Standing, Villach (AT); Milko Paolucci, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/654,447

(22) Filed: Oct. 18, 2012

(65) Prior Publication Data

US 2014/0110820 A1   Apr. 24, 2014

(51) Int. Cl.

| | |
|---|---|
| *H01L 21/50* | (2006.01) |
| *H01L 23/498* | (2006.01) |
| *H01L 23/367* | (2006.01) |
| *H01L 25/16* | (2006.01) |
| *H05K 1/02* | (2006.01) |
| *H05K 1/18* | (2006.01) |

(52) U.S. Cl.
CPC ....... *H01L 23/49822* (2013.01); *H01L 23/367* (2013.01); *H01L 25/16* (2013.01); *H05K 1/0209* (2013.01); *H01L 2924/0002* (2013.01); *H01L 2924/19041* (2013.01); *H01L 2924/19042* (2013.01); *H01L 2924/19043* (2013.01); *H05K 1/185* (2013.01); *H05K 2201/1003* (2013.01); *H05K 2201/10015* (2013.01); *H05K 2201/10022* (2013.01)

(58) Field of Classification Search
CPC .................................................. H05K 1/0209
USPC .................................. 257/528, 713; 361/720
See application file for complete search history.

(56) References Cited

U.S. PATENT DOCUMENTS

| | | | |
|---|---|---|---|
| 8,730,677 B2 * | 5/2014 | Wald et al. .................... | 361/720 |
| 2011/0031611 A1 * | 2/2011 | Standing ...................... | 257/700 |

* cited by examiner

*Primary Examiner* — Mark Prenty
(74) *Attorney, Agent, or Firm* — Slater Matsil, LLP

(57) ABSTRACT

Representative implementations of devices and techniques provide improved thermal performance of a chip die disposed within a layered printed circuit board (PCB). Passive components may be strategically located on one or more surfaces of the PCB. The passive components may be arranged to conduct heat generated by the chip die away from the chip die.

13 Claims, 5 Drawing Sheets

PASSIVE COMPONENT AS THERMAL CAPACITANCE AND HEAT SINK

BACKGROUND

Developments in semiconductor technologies over the last few years have allowed the Figure of Merit (FoM) and circuit efficiency to be maintained, or even in some cases improved, as the size of a semiconductor device continually shrinks. This means that a modern integrated circuit device (e.g., chip die or power semiconductor device) generally has a lesser connection area (or footprint) than earlier generations of dice, and it has a much greater effective power density per given area. This also means that thermal loading over a given area also has increased.

Exemplary semiconductor technologies that use a shrinking form factor include embedded die and packaging technologies. In one example, an integrated circuit (IC) chip die may be located within a core layer of a printed circuit board (PCB), or between layers of a multi-layer circuit board. This technique frees up surface area on the PCB layer surfaces for other circuit components. Thus, more components resulting in greater application feature sets may be contained within a smaller package. Heat management of the die within the PCB is important for predictable circuit performance and to prolong the life of the semiconductor device and associated packaging and circuit topology, particularly when considering increases in thermal loading.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1A:
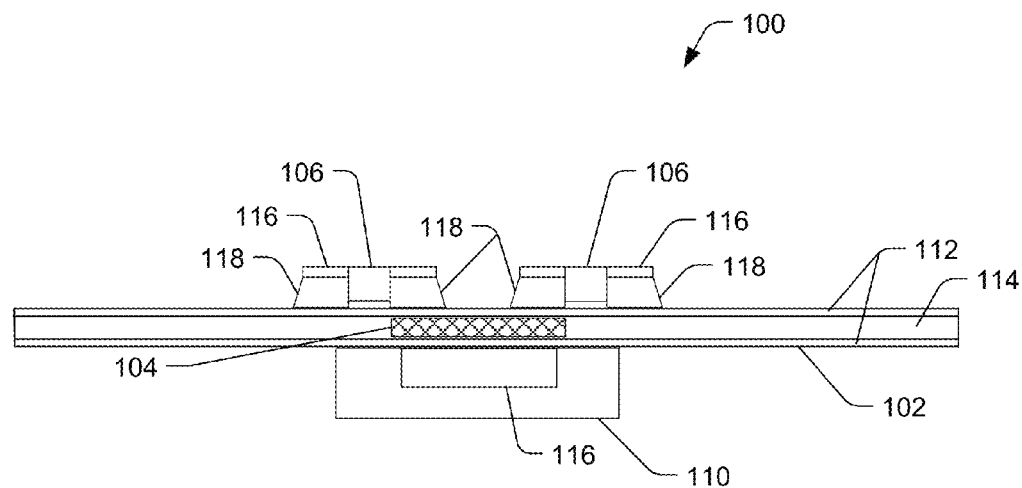
FIG. 1A is a cross-sectional profile view of an example thermal management arrangement including a PCB, an IC chip die and other discrete circuit components, according to an implementation.

Representative implementations of devices and techniques provide improved thermal performance of a chip die disposed within a layered printed circuit board (PCB). Passive components may be strategically located on one or more surfaces of the PCB. The passive components may be arranged to conduct heat generated by the chip die away from the chip die.

In an implementation, the passive components are part of an electrical circuit that includes the chip die. For example, the passive components may conduct electrical current as part of an electrical circuit that includes circuit components formed on the chip die. The electrical current may pass through one or more of the passive components as well as through portions of circuit components or circuits formed on the chip die.

In another implementation, the passive components may be placed or positioned such that portions of the passive components overlap portions of the chip die. For example, electrical contacts or terminals of the passive components may overlap contact areas of the chip die.

In alternate implementations, the passive components may be strategically or deliberately placed or positioned to optimize a cooling capacity of the chip die. In one example, a passive component is located such that it forms a thermal capacitance with respect to the chip die. In another example, the passive component is located such that it forms a heat sink with respect to the chip die.

Various implementations and arrangements are discussed with reference to electrical and electronics components and varied carriers. While specific components (i.e., integrated circuit chip dice, resistors, capacitors, inductors, chokes, etc.) are mentioned, this is not intended to be limiting, and is for ease of discussion and illustrative convenience. The techniques and devices discussed with reference to a chip die are applicable to any type or number of electrical components (e.g., sensors, transistors, diodes, etc.), circuits (e.g., integrated circuits, analog circuits, digital circuits, mixed circuits, ASICS, memory devices, processors, etc.), groups of components, packaged components, structures, and the like, that may be fully or partially embedded within a carrier, such as a layered printed circuit board (PCB). Further, the techniques and devices discussed with reference to passive components are applicable to any type or number of discrete components (e.g., resistors, capacitors, inductors, chokes, coils, memristors, etc.), groups of components, and the like. Additionally, the techniques and devices discussed with reference to a printed circuit board (PCB) are applicable to other types of carriers (e.g., board, chip, wafer, substrate, package, container, can, module, etc.) that the chip die may be mounted fully or partially on or within.

Various terminologies are used in this disclosure. As those skilled in the art appreciate, chip die may refer to a semiconductor device/die, semiconductor power device/die, or the like; an IC die or device may be understood to include a number of electrical components (e.g., transistors) that provide a particular level of functionality, such as and IC driver or IC controller; and a component may be understood to include a circuit element (e.g., a capacitor) that may be packaged or housed in an IC body.

Implementations are explained in more detail below using a plurality of examples. Although various implementations and examples are discussed here and below, further implementations and examples may be possible by combining the features and elements of individual implementations and examples.

Example Arrangement

Figure 1B:
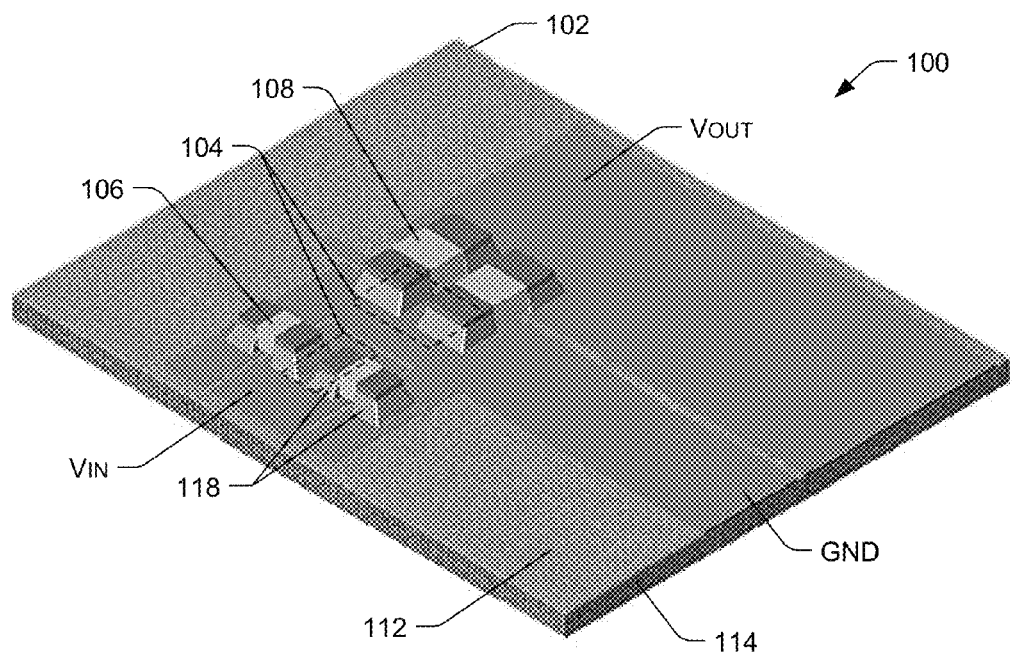
FIG. 1B is a perspective view of the example arrangement of FIG. 1A. The illustration shows example locations of embedded chip dice in relation to the discrete components.
Figure 2:
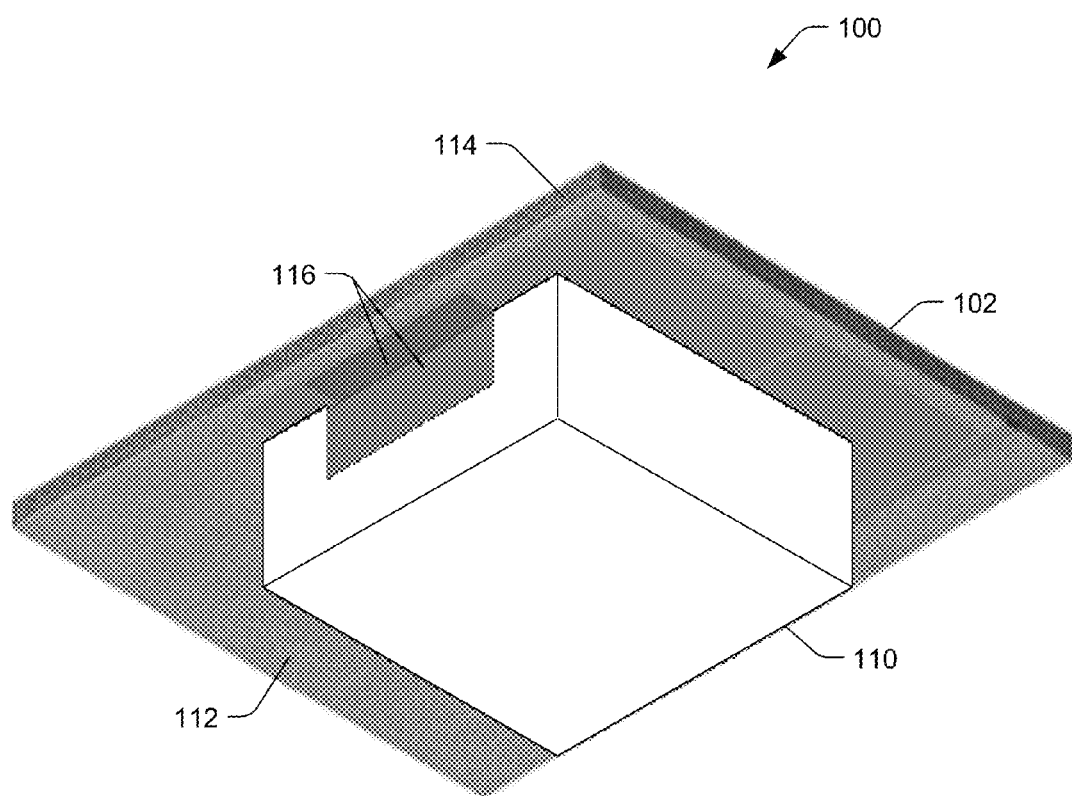
FIG. 2 is perspective view of the underside of the arrangement of FIG. 1A, showing additional discrete components mounted on the underside of the PCB, for example.

FIG. 1A is a cross-sectional profile view of an example thermal management arrangement 100 including a printed circuit board (PCB) 102, an integrated circuit (IC) chip die 104 and other passive circuit components 106, 108, and 110, according to an implementation. FIG. 1B is a perspective view of the example arrangement 100 of FIG. 1A. FIG. 2 is perspective view of the underside of the arrangement 100 of FIG. 1A, showing the passive component(s) 110 mounted on the underside, for example.

Figure 3A:
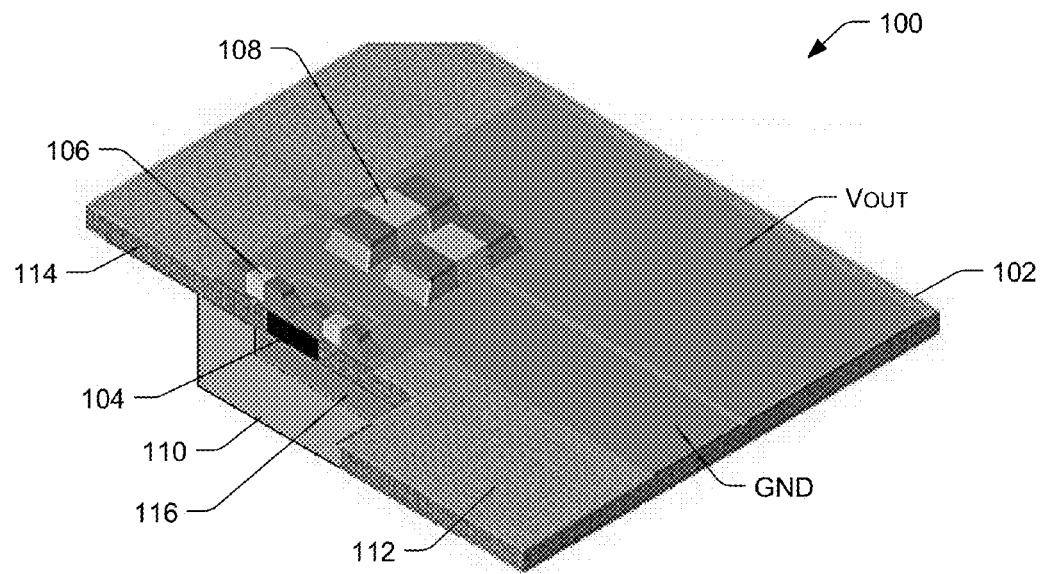
FIG. 3A is a first cut-away perspective view of the example arrangement of FIG. 1A, showing an embedded chip die in relation to the discrete components, according to an implementation.
Figure 3B:
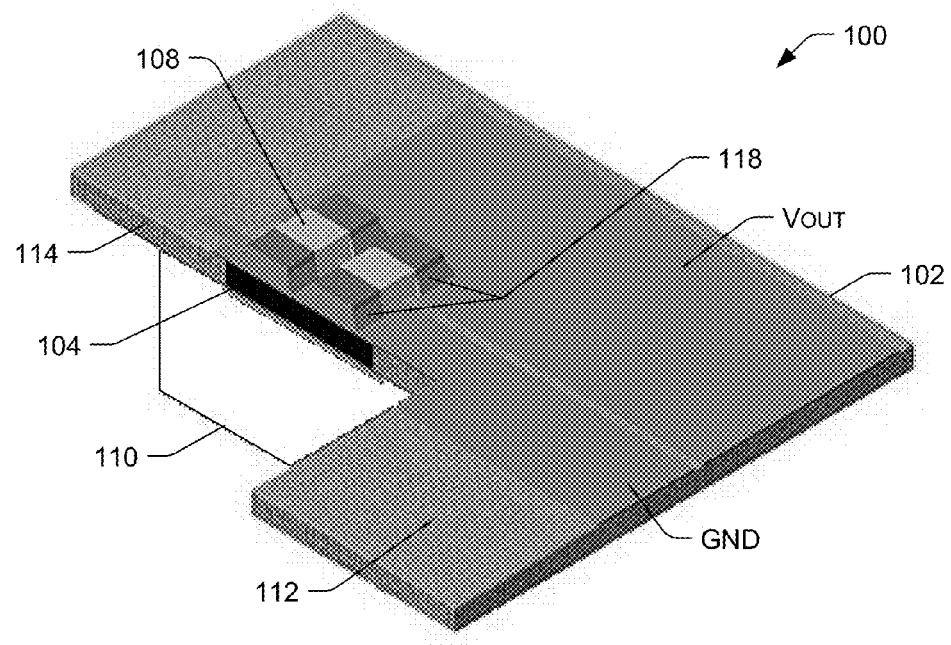
FIG. 3B is a second cut-away perspective view of the example arrangement of FIG. 1A, showing another embedded chip die in relation to the discrete components, according to an implementation.
Figure 4:
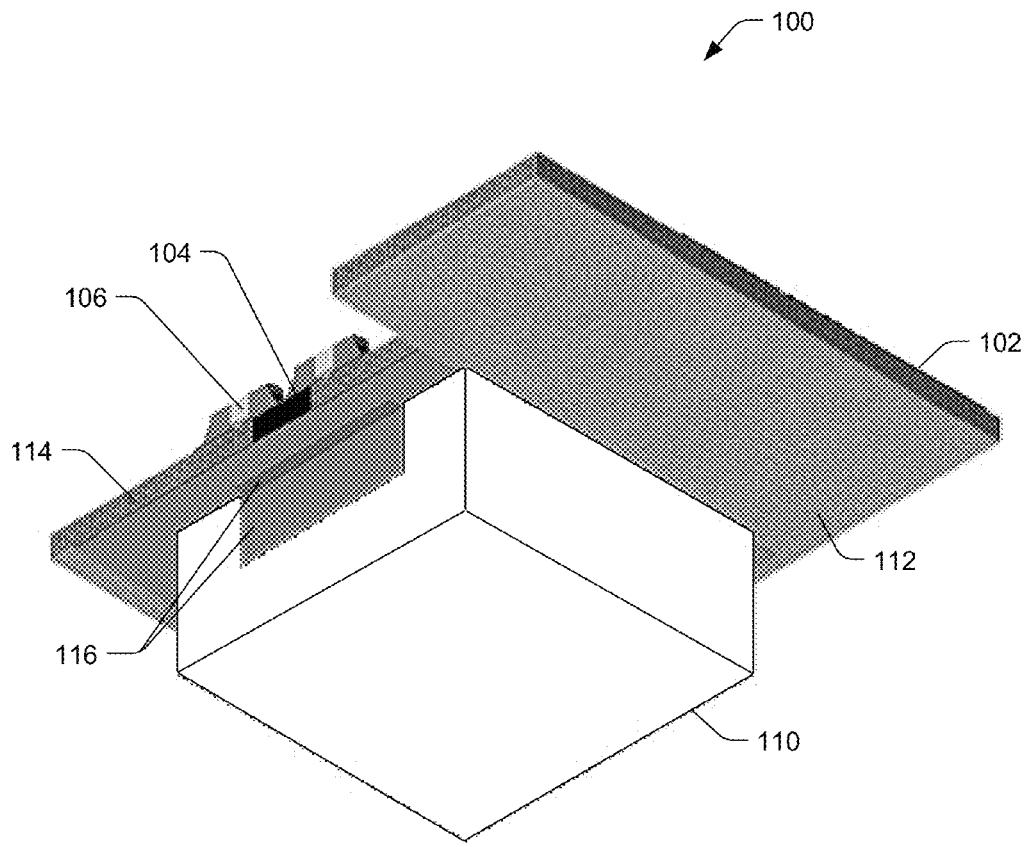
FIG. 4 is cut-away perspective view of the underside of the arrangement of FIG. 1A, showing an embedded chip die in relation to the additional discrete components mounted on the underside of the PCB, for example.

FIGS. 3A, 3B, and 4 are cut-away perspective views of the example arrangement 100 of FIG. 1A, showing example locations of embedded chip dice 104 in relation to locations of several passive components 106, 108, and 110, according to various implementations.

The arrangement 100 represents an example environment whereby the techniques and devices discussed herein may be applied. For example, the chip die 104 represents any and all electrical devices that may be located (e.g., partially or fully embedded, etc.) within layers of a PCB 102. The components 106, 108, and 110 represent any and all passive components that may be located on a surface of a layer of the PCB 102. The techniques, components, and devices described herein with respect to the arrangement 100 are not limited to the illustrations in FIGS. 1A-4, and may be applied to other designs, types, arrangements, and constructions including other electrical components without departing from the scope of the disclosure. In some cases, alternative components may be used to implement the techniques described herein. In various implementations, the arrangement 100 may be a stand-alone module, or it may be a portion of a system, component, structure, or the like.

In an implementation, the PCB 102 is comprised of multiple layers 112. For example, the PCB 102 may have two layers 112, as shown in FIG. 1A, or it may be comprised of fewer or more layers 112. In one implementation, the PCB 102 includes a "core" layer 114 located between two of the layers 112.

In alternate implementations, the chip die 104 is located between two layers 112, and may be embedded within the core layer 114. In one implementation, the chip die 104 is located fully within the layers 112 of the PCB 102. In an alternate implementation, the chip die 104 is located partially within the layers 112 of the PCB 102. For example, one or more surfaces of the chip die 104 may be exposed or extend outside of the PCB 102 while the chip die 104 is located partially within the PCB 102.

In an implementation, as shown in FIGS. 1A-4, the arrangement 100 includes one or more passive components 106, 108, and 110. For example, as discussed above, a passive component (106, 108, 110) may comprise one or more of resistors, capacitors, inductors, chokes, coils, memristors, and the like. In various implementations, the passive component(s) (106, 108, 110) are part of an electrical circuit that includes the chip die 104. For example, the passive components (106, 108, 110) may conduct electrical current (or block or transform current, etc.) as part of an electrical circuit that includes circuit components formed on the chip die 104. The electrical current may pass through one or more of the passive components (106, 108, 110) as well as through portions of the chip die 104, including circuit components or circuits formed on the chip die 104.

For example, the layout illustrated in FIGS. 1A-4 shows circuit design, such as a synchronous buck or a half-bridge. The chip dice 104 are represented by low and high side transistors (e.g., field-effect transistors (FET), etc.), for example. The passive components 106 are represented by input capacitors, for example, placed between the input voltage Vin and ground GND. The passive components 108 are represented by output capacitors, for example, placed between the output voltage Vout and GND. The passive component 110 is represented by an output inductor, for example. In an implementation, as shown in FIGS. 1A-4, the placement of the passive components (106, 108, 110) with respect to the chip dice 104 provides optimized performance (e.g., power efficiency, speed, etc.) of the circuit.

In alternate implementations, one passive component (106, 108, 110) may be included in an arrangement 100, where the passive component (106, 108, 110) is strategically located on an outer surface of one of the layers 112 of the PCB 102, or multiple passive components (106, 108, 110) may be included in an arrangement 100, where the passive components (106, 108, 110) are strategically located on the outer surface of either or any layer 112 of the PCB 102. For example, one or more passive components (106, 108, 110) may be located on each of the layers 112 of the PCB 102, or located on one or more of the layers 112 of a multi-layer PCB 102.

In an implementation, a circuit (such as the half-bridge circuit design shown in FIGS. 1A-4, for example) is designed and laid out on a multi-layer PCB 102 for optimized performance of the circuit elements, including optimized thermal performance. For example, the circuit is designed and laid out such that the circuit elements have optimized speed of operation, impedance characteristics, functional characteristics, power consumption profiles, parasitic performance, longevity, and the like, and also provide optimized management of heat generated by the circuit elements (and particularly the chip dice 104). In one implementation, the circuit does not make use of conventional heat sinks (e.g., heat sinks that are not part of current path(s), etc.).

In various implementations, one or more passive components (106, 108, 110) are strategically located on one or more layers 112 of the PCB 102 to conduct heat generated by the chip die 104 away from the chip die 104. For example, the passive components (106, 108, 110) are deliberately placed to improve the cooling capability of the chip die 104.

In an implementation, cooling effects of the passive components (106, 108, 110) are exploited based on the strategic placement of the passive components (106, 108, 110) with respect to the chip dice 104. The proximity of the passive components (106, 108, 110) allows heat generated by the chip die 104 to be thermally conducted to the passive components (106, 108, 110) either by direct contact or through thermal capacitance, and dissipated into the environment. For example, as shown in FIGS. 1A-4, the passive components (106, 108, 110) may be deliberately or strategically placed above or below the chip dice 104. In one implementation, as illustrated in FIGS. 1A-4, one or more passive components (106, 108, 110) are strategically located on an outer surface of one or more layers 112 of the PCB 102, and overlap at least a portion of the chip die 104. The strategic overlapping of the passive components (106, 108, 110) can optimize heat transfer between the chip die 104 and the passive components (106, 108, 110).

In an implementation, the surface area and/or mass of the passive components (106, 108, 110) aids in dissipating heat to the environment. In various implementations, the greater the surface area and/or mass of a passive component (106, 108, 110), the greater the heat dissipation capability of the passive component (106, 108, 110).

In one implementation, a passive circuit component (106, 108, 110) has a substantially planar form. For example, the planar form of the passive component (106, 108, 110) may be arranged to be parallel to the layers 112 of the PCB 102. In alternate implementations, the planar form of the passive component (106, 108, 110) may be arranged to be otherwise oriented (e.g., perpendicular, diagonal, etc.) to the layers 112 of the PCB 102.

In another implementation, as illustrated in FIGS. 1B-4, the passive circuit component (106, 108, 110) has a measurable length, width, and depth. For example, the passive component (106, 108, 110) has a three-dimensional form (e.g., thickness) and includes a surface area that is substantially greater than a footprint of the passive component (106, 108, 110). In various implementations, depending on the materials of the passive component (106, 108, 110), the three-dimensional passive component (106, 108, 110) has greater heat dissipation capability than a substantially planar passive component (106, 108, 110) of similar footprint. This is due to the increased surface area and/or mass of the three-dimensional passive component (106, 108, 110) over the substantially planar passive component (106, 108, 110).

In an implementation, the location or placement of passive components (106, 108, 110) above (or below) the chip die 104 assists in transporting heat away from the chip die 104 in a similar manner to heat pipes or heat spreaders. For example, the heat from the chip die 104 may be spread over a surface area and/or mass equal to that of the passive components (106, 108, 110), improving the efficiency of heat dissipation within the system. In some cases, lateral heat transfer (e.g., heat spreading) may be further improved with thicker passive components (106, 108, 110), for example.

In one implementation, one or more terminal connections 116 of the passive circuit component (106, 108, 110) and/or soldering material 118 coupling the passive circuit component (106, 108, 110) to the PCB 102 contribute to conducting heat generated by the chip die 104 away from the chip die 104. For example, the terminals 116, solder 118, and the pad that the passive component (106, 108, 110) is soldered to, all may add to the surface area available for cooling the chip die 104 (e.g., dissipating heat from the chip die 104).

In one implementation, the contact terminals 116 of one or more of the passive components (106, 108, 110) are placed above (or below) a chip die 104, with isolation (e.g., an electrically insulating layer, etc.) between the contact terminal 116 of the passive component (106, 108, 110) and the contact terminal(s) (not shown) of the chip die 104. In the implementation, the one or more passive components (106, 108, 110) are thermally coupled to the chip die 104, forming a thermal capacitance. Heat from the chip die 104 may be conducted to the passive component (106, 108, 110) through the insulating layer due to the thermal capacitance.

In another implementation, one or more conductive terminals of the chip die 104 are electrically and/or mechanically coupled to one or more contact terminals 116 of at least one passive component (106, 108, 110). In various implementations, the coupling may be through soldering, or the like. In the implementation, heat from the chip die 104 may be directly conducted to the passive component(s) (106, 108, 110) through the electrical/mechanical connection of the terminals 116, including the solder joints 118, and the like.

Different mounting configurations for an arrangement 100 may be possible with different implementations. In alternate implementations, various other combinations and designs of the arrangement 100 are also within the scope of the disclosure. The variations may have fewer elements than illustrated in the examples shown in FIG. 1A through FIG. 4, or they may have more or alternative elements than those shown.

Representative Process

Figure 5:
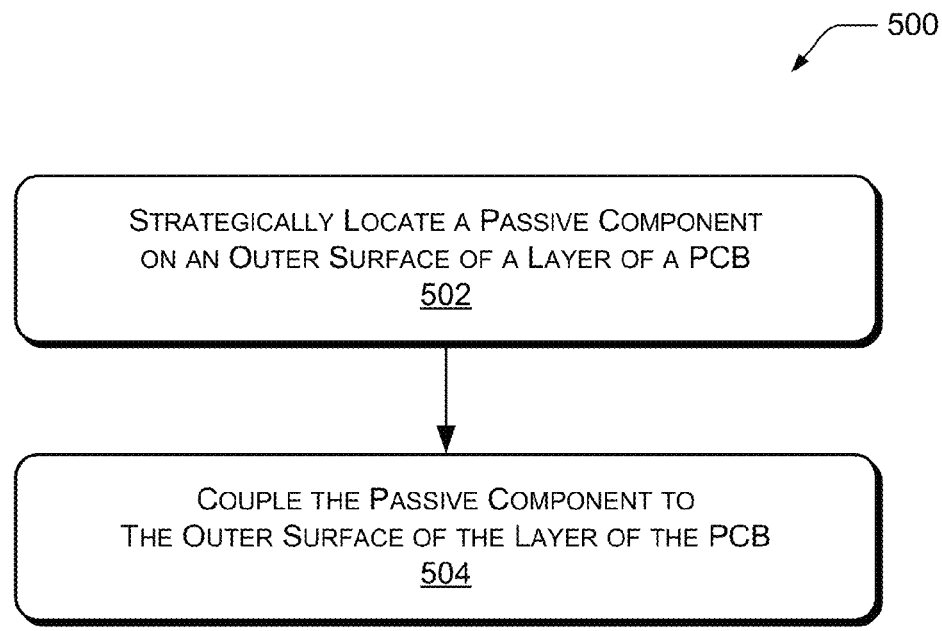
FIG. 5 is a flow diagram illustrating an example process for improving the thermal performance of a chip die embedded within a layered printed circuit board (PCB), according to an implementation.

FIG. 5 illustrates a representative process 500 for improving thermal performance of a chip die (such as chip die 104, for example) located within a carrier (such as PCB 102, for example), according to various implementations. In various implementations, the chip die may be partially or fully embedded within layers of the PCB. The process 500 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 502, the process includes strategically locating a passive component (such as passive components 106, 108, 110, for example) on an outer surface of a first layer or a second layer (such as layers 112, for example) of a printed circuit board (PCB) (such as PCB 102, for example). In various implementations, the PCB may have any number of layers. In one implementation, the passive component conducts heat generated by a chip die disposed between the first layer and the second layer away from the chip die.

At block 504, the process includes coupling the passive component to the outer surface of the first layer or the second layer of the PCB at the strategic location.

In an implementation, the process includes coupling a second passive component to a predetermined location on an outer surface of the other of the first layer or the second layer of the PCB such that the second passive component conducts heat generated by the chip die away from the chip die.

Further, in some implementations, the process includes strategically coupling a plurality of passive components to an outer surface of the first layer and/or an outer surface of the second layer of a multi-layer PCB such that the passive components conduct heat generated by the chip die embedded between two layers of the PCB away from the chip die. In an implementation, the passive components conduct electrical current as part of an electrical circuit that includes the chip die. Accordingly, the passive components are a part of a circuit comprising the chip die and the passive components.

In various implementations, the passive component(s) may be coupled to the surface(s) using various techniques (e.g., soldering, press-fit, connectors, surface mount technologies, through-hole technology, and so forth).

In various implementations, the first passive component and the second passive component (as well as any other passive circuit components arranged for heat management) are selected from a set comprising: resistors, capacitors, inductors, and chokes. In alternate implementations, the passive components may be comprised of other devices, elements, circuits, and the like.

In an implementation, the process includes localizing the passive component(s) on the outer surface of the first layer or the second layer of the PCB to optimize a cooling capability of the chip die. For example, in an implementation, the process includes overlapping one or more termination contacts of the passive component(s) over a predetermined portion of the chip die. For example, the predetermined portion of the chip die may include a conductive contact of the chip die, or the like.

In one implementation, the process includes electrically isolating the passive component(s) from the chip die. For example, a layer of electrical insulation (e.g., an insulating PCB layer, etc.) may be disposed between the passive component(s) and the chip die. In the implementation, the process includes conducting, by the passive component(s), the heat generated by the chip die away from the chip die by capacitive thermal transfer.

In one implementation, the process includes deliberately positioning the passive component to form a thermal capacitance with respect to the chip die. For example, this may include the use of an isolating layer between the passive component and the chip die. In another implementation, the process includes deliberately positioning the passive component to form a heat sink with respect to the chip die. For example, this may include directly coupling (e.g., electrically and/or mechanically coupling) the passive component to the chip die. In one implementation, a terminal of the passive component is mechanically coupled to a terminal of the chip die.

In alternate implementations, other techniques may be included in the process 500 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A system, comprising:
 a printed circuit board (PCB) including at least a first layer and a second layer;
 a chip die disposed between the first layer and the second layer; and
 a passive component strategically located on an outer surface of one of the first layer or the second layer, and arranged to conduct heat generated by the chip die away from the chip die, the passive component overlapping a portion of the chip die.

2. The system of claim 1, further comprising a second passive component strategically located on an outer surface of the other of the first layer and the second layer of the PCB, and arranged to conduct heat generated by the chip die away from the chip die.

3. The system of claim 1, further comprising a plurality of passive components strategically located on the outer surface of the first layer or the second layer of the PCB, each of the plurality of passive components overlapping a portion of the chip die.

4. The system of claim 3, wherein each of the plurality of passive components is electrically coupled to one or more contacts of the chip die.

5. The system of claim 3, wherein each of the plurality of passive components is thermally coupled to the chip die.

6. The system of claim 5, further comprising an electrically insulating layer disposed between one or more of the plurality of passive components and the chip die.

7. The system of claim 1, wherein the passive component comprises one of a resistor, a capacitor, an inductor, and a choke.

8. The system of claim 1, wherein the passive component is a functional element of an electrical circuit that includes the chip die.

9. A system, comprising:
 a multi-layer printed circuit board (PCB) including a plurality of layers;
 a chip die embedded within the PCB, between two of the plurality of layers; and
 a passive circuit component strategically located on an outer surface of one of the two layers of the plurality of layers, and arranged to conduct heat generated by the chip die away from the chip die, the passive component overlapping a portion of the chip die.

10. The system of claim 9, wherein a contact terminal of the passive circuit component is coupled to a conductive terminal of the chip die.

11. The system of claim 9, wherein terminal connections of the passive circuit component and/or soldering material coupling the passive circuit component to the PCB contribute to conducting the heat generated by the chip die away from the chip die.

12. The system of claim 9, wherein the passive circuit component has a substantially planar form, the planar form parallel to the plurality of layers of the PCB.

13. The system of claim 9, wherein the passive circuit component has a length, a width, and a depth, and includes a surface area that is substantially greater than a footprint of the passive component.

* * * * *